United States Patent [19]

Robertson et al.

[11] Patent Number: 5,245,421
[45] Date of Patent: Sep. 14, 1993

[54] APPARATUS FOR INSPECTING PRINTED CIRCUIT BOARDS WITH SURFACE MOUNTED COMPONENTS

[75] Inventors: Gordon I. Robertson, Pennington; Abe Abramovich, Lawrenceville, both of N.J.

[73] Assignee: Control Automation, Incorporated, Princeton, N.J.

[21] Appl. No.: 587,169

[22] Filed: Sep. 19, 1990

Related U.S. Application Data

[63] Continuation of Ser. No. 159,774, Feb. 24, 1988, abandoned.

[51] Int. Cl.$^5$ ............................................. H04N 7/18
[52] U.S. Cl. .................................... 358/101; 358/106
[58] Field of Search ............... 358/101, 106; 356/237, 356/375, 376; 250/562, 563

[56] References Cited

U.S. PATENT DOCUMENTS

| | | |
|---|---|---|
| 3,274,549 | 9/1966 | Moskowitz . |
| 3,761,876 | 9/1973 | Flaherty et al. . |
| 3,804,531 | 4/1974 | Kosaka et al. . |
| 3,911,212 | 10/1975 | Yoshizawa et al. . |
| 4,028,728 | 6/1977 | Sharp .................................. 358/106 |
| 4,145,714 | 3/1979 | MacDonald et al. ........... 356/241 X |
| 4,162,481 | 7/1979 | DuVall . |
| 4,191,940 | 3/1980 | Polcyn et al. . |
| 4,291,334 | 9/1981 | Mese et al. . |
| 4,343,553 | 8/1982 | Nakagawa et al. . |
| 4,421,410 | 12/1983 | Karasaki . |
| 4,486,775 | 12/1984 | Catlow .................................... 358/106 |
| 4,516,855 | 5/1985 | Korth . |
| 4,553,843 | 11/1985 | Langley et al. . |
| 4,585,351 | 4/1986 | Gronek et al. ................... 356/237 X |
| 4,604,648 | 8/1986 | Kley .................................... 358/101 |
| 4,650,333 | 3/1987 | Crabb et al. ..................... 358/106 X |
| 4,686,565 | 8/1987 | Ando .................................... 358/106 X |
| 4,688,939 | 8/1987 | Ray .................................... 358/106 X |
| 4,695,157 | 9/1987 | Schoenbaum et al. ......... 356/446 X |

Primary Examiner—Victor R. Kostak
Attorney, Agent, or Firm—Weiser & Associates

[57] ABSTRACT

An apparatus for inspecting an SMT printed circuit board includes an inspection head mounted to an X-Y table, for directed movement above the SMT printed circuit board which is to be inspected. The inspection head is caused to proceed to successive viewing fields along the surface of the SMT printed circuit board, for inspection by a series of cameras disposed within the inspection head together with appropriate lighting which is selected according to the inspection which is to be performed. Prior to soldering, it is determined whether each of the series of components to be placed on the printed circuit board were deposited as scheduled, and whether the deposited components were correctly positioned. Following the soldering procedure, it is again determined whether each component remains present on the board, and in its correct position, and steps are taken to inspect the solder fillets, and to inspect for any solder bridges.

27 Claims, 4 Drawing Sheets

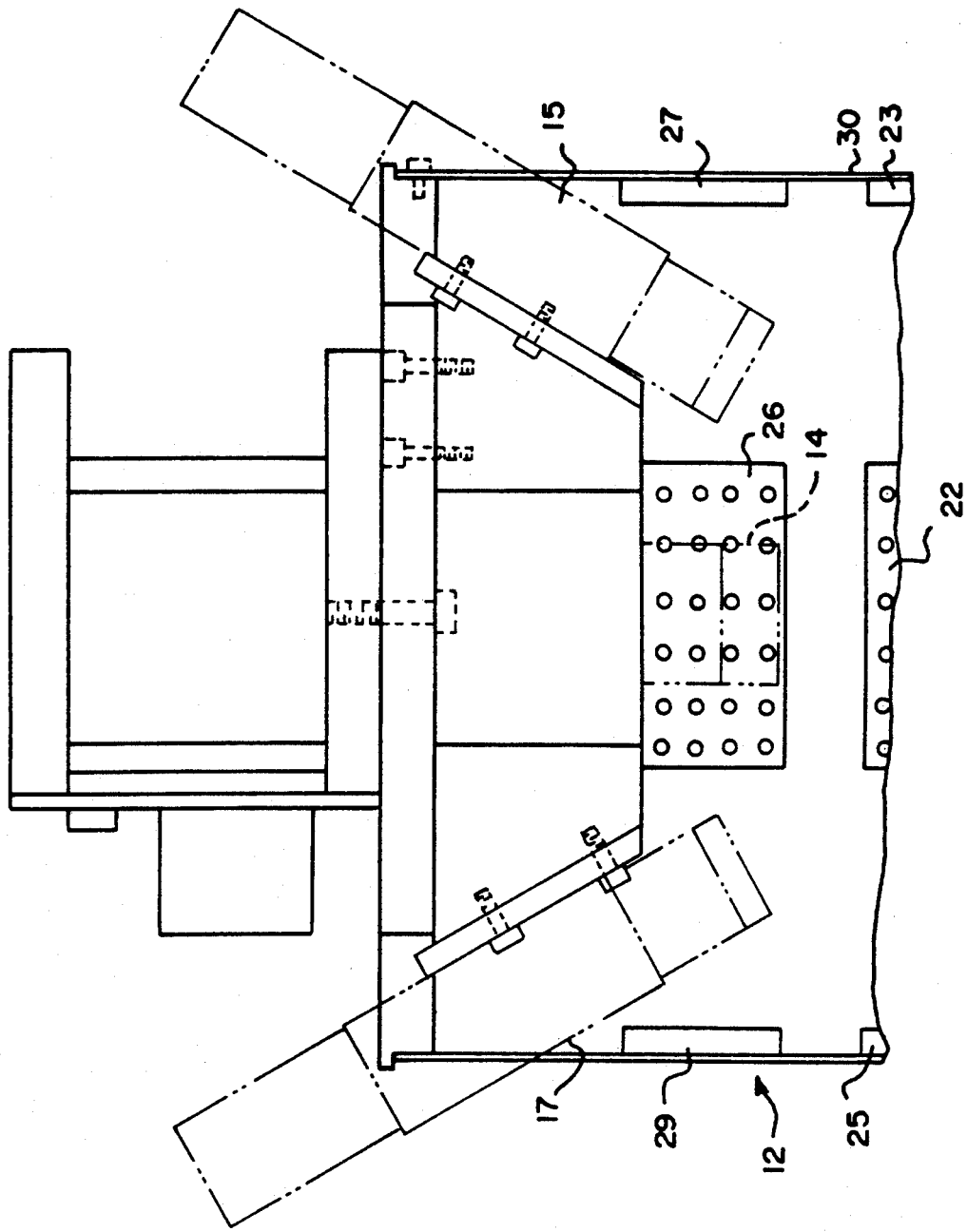

APPARATUS FOR INSPECTING PRINTED CIRCUIT BOARDS WITH SURFACE MOUNTED COMPONENTS

This application is a continuation of application Ser. No. 07/159,774 filed Feb. 24, 1988, now abandoned.

BACKGROUND OF THE INVENTION

This invention relates generally to a system for inspecting printed circuit boards, and more particularly, to a system for inspecting printed circuit boards with surface mounted components to verify correct component placement and proper solder connections.

As is known to persons skilled in the art, a printed circuit board is used for mounting and electrically interconnecting electrical components in a predetermined manner. Traditionally, this was accomplished using through-the-hole technology which involved the placement of components on the top side of a printed circuit board so that the connecting leads or pins of the components extended through holes (generally plated) provided in the circuit board. The leads or pins extending through the circuit board were then bent over to mechanically clamp the electrical components to the printed circuit board, followed by an appropriate soldering operation to complete the necessary connections.

It has become traditional for such printed circuit boards to be constructed mechanically, using automated assembly machines which operate to reduce the often prohibitive costs of manually assembling a printed circuit board. While reducing overall costs, such automated assembly has been found to result in periodic mis-insertions of the components, and their leads or pins, resulting in an ineffective and unreliable electrical connection. Considering the costs which inherently result from such mis-insertions, a variety of steps have been taken to locate mis-insertions, or other placement errors, as early as possible in the assembly process. This is because the cost of correcting an error increases significantly as the board proceeds through subsequent manufacturing, and distribution steps. For example, a mis-insertion which is found prior to soldering is inexpensively repaired, while a mis-insertion which is not found until final assembly (in a product) is often so costly to repair that the assembled board is often discarded rather than attempting to locate and correct the problem.

Early efforts to locate mis-insertions, and other assembly errors, involved a visual inspection of each printed circuit board at a desired stage of the manufacturing process, by human operators using the naked eye, or possibly a stereo microscope or the like. However, since it is not uncommon for a typical printed circuit board to have from 1,000 to 10,000 leads or pins for connection, such a job was found to be extremely tedious and inaccurate. Accordingly, even under the best of conditions, a significant number of missed assembly errors was found to result. Added to this were the increased costs of such an inspection process due to the significant amount of time which was required, and the correspondingly increased inventories which were necessary to accommodate such visual inspections.

For this reason, steps were taken to develop automated systems for inspecting printed circuit boards, to replace such visual inspections. One such device, which has found wide acceptance in the industry, is the Model 5511A Printed Circuit Board Inspection System which is distributed by the Universal Instruments Corporation of Binghamton, N.Y. This apparatus generally employs a series of cameras which are mounted within a fixture (an inspection head) adapted for movement upon an X-Y table to inspect various portions of a printed circuit board (from its underside) which is placed over the X-Y table. The inspection head is sequentially advanced to successive viewing fields (typically 2"×2") established along the surface of the printed circuit board to inspect (through microprocessor analysis) the leads or pins which extend through the printed circuit board, to its bottom, to verify their effective placement based upon a comparison with pre-established norms for the particular printed circuit board which is being tested. Any defects are then reported to the operator, for appropriate correction.

The accuracy of this inspection is enhanced by providing an inspection head which incorporates a series of four angled, orthogonally placed cameras, each of which is provided with its own corresponding light source (preferably a series of controllable LED's). Such structure is provided to enable each viewing field to be inspected from four different perspectives, making sure that a lead or pin which extends from the through-hole is detected in at least one of these four orientations. Through microprocessor controls associated with the apparatus, each of a series of anticipated leads or pins can be checked for proper placement in a highly reliable and automated fashion, eliminating the need for tedious visual inspections and the like.

However, recent advances in technology have resulted in a trend toward the replacement of through-the-hole printed circuit boards with so-called surface mount technology (SMT). Rather than making use of apertures to receive leads or pins fed through the printed circuit board to its underside, for appropriate connection, SMT printed circuit boards incorporate components (both active and passive) which are placed on top of the printed circuit board so that their leads communicate with conductive pads associated with the top face of the printed circuit board. These components are then electrically connected to their associated pads by an appropriate soldering operation, from the top of the board.

With the expanded use of SMT printed circuit boards came the expanded need for automated machinery to inspect component positioning and the electrical connections which were being produced. This included the need for a variety of testing procedures, which extended beyond the basic testing procedures needed to inspect through-the-hole printed circuit boards, such as verification of the placement of SMT components, both before and after the soldering procedure, and a check on resulting soldering connections. It therefore remained to develop a system which was capable of performing these functions on an expedited basis and in automated fashion.

SUMMARY OF THE INVENTION

It is therefore the primary object of the present invention to provide a system for verifying the placement and connection of SMT components to a printed circuit board.

It is also an object of the present invention to provide a system for verifying that an SMT component has been placed on the printed circuit board, in the correct orientation.

It is also an object of the present invention to provide a system for verifying such conditions both prior to, and subsequent to, the soldering procedure.

It is also an object of the present invention to provide a system for verifying that an SMT component has been effectively soldered to the printed circuit board.

It is also an object of the present invention to provide a system which is capable of performing the foregoing tasks in an automated fashion, and on a rapid basis.

It is also an object of the present invention to provide a system which is capable of performing the foregoing tasks yet which is sufficiently simple for use by an operator of limited training, while minimizing potential operator fatigue.

These and other objects are achieved in accordance with the present invention by providing an apparatus which is capable of sequentially monitoring a series of defined viewing fields associated with an SMT printed circuit board, much the same as the automated devices which were used to monitor through-the-hole printed circuit boards, such as the Model 5511A Printed Circuit Board Inspection System. To this end, an inspection head is mounted to an X-Y table, for directed movement above an SMT printed circuit board which is to be inspected. Both the inspection head, and the X-Y table which supports it, are essentially the same as the corresponding structures of the Model 5511A Printed Circuit Board Inspection System, but are placed in an inverted orientation. The inspection head is caused to proceed to successive viewing fields along the surface of the SMT printed circuit board, for inspection by a series of four angled cameras which are orthogonally disposed within the inspection head to inspect each viewing field from four different perspectives. Appropriate lighting (lighting groups) is provided for use in connection with each of the four cameras to effectively illuminate the viewing field which is being inspected. Microprocessor means are provided to control both the lighting which is used to illuminate each viewing field, as well as the cameras associated with the inspection head, and to perform the series of tests which are necessary to verify the integrity of the SMT printed circuit board.

For example, prior to soldering, it is necessary to determine whether each of the series of components which were to have been placed on the printed circuit board were deposited as scheduled, and whether the deposited components were correctly positioned. To this end, each of the series of four cameras is sequentially accessed to inspect a particular viewing field from each of four different directions. This is accomplished by selectively acquiring the image which is then being received by the video camera, and converting the acquired image to binary values (for subsequent digital processing) using video conversion techniques which are themselves known to persons of ordinary skill in this art. The lighting group which is immediately adjacent to the camera which has been accessed (either a "high" lighting group which is provided near the camera or a "low" lighting group which is provided near the printed circuit board, or both) is used to effectively illuminate the viewing field to obtain the information which is necessary to make these determinations. Defects are appropriately brought to the attention of the operator.

Following the soldering procedure, it is again necessary to verify that each component remains present on the board, and in its correct orientation, to make sure that the component has not moved between the placement and soldering steps. This is accomplished using the same procedures which were performed prior to soldering. However, following soldering, it is further necessary to verify the integrity of each of the soldering connections associated with the printed circuit board. This includes an inspection of each soldering connection to determine the integrity of the "fillet" which has been produced, and to check for "solder bridges" which may have been produced between adjacent solder connections.

To inspect the integrity of the solder fillets, each of the series of four cameras is again sequentially accessed. However, the lighting which is used in connection with a particular camera is modified so that when a selected camera is accessed, each of two laterally disposed lighting groups which are provided as part of the system are simultaneously activated. This causes illumination of the sides of the solder fillet, which can then be used to make a determination regarding the shape of that fillet. To inspect for solder bridges, steps are taken to again sequentially access each of the four cameras which are provided, in combination with one of the lighting groups (preferably the "high" lighting group) which are located adjacent to the camera, to effectively illuminate a detected solder bridge. In either case, the operator is again advised of any detected defects.

These determinations are made as the inspection head of the apparatus is advanced over the surface of the SMT printed circuit board by the X-Y table, to provide an automated inspection of each of the series of viewing fields which are associated with the printed circuit board. For further detail regarding a system having the foregoing capabilities, reference is made to the detailed description which is provided below, taken in conjunction with the following illustrations.

BRIEF DESCRIPTION OF THE DRAWINGS

FIG. 4 is a partial side elevational view of the inspection head, with portions broken away to reveal internal construction detail.

In the several views provided, like reference numerals denote similar structure.

DETAILED DESCRIPTION OF THE PREFERRED EMBODIMENT

Figure 1:
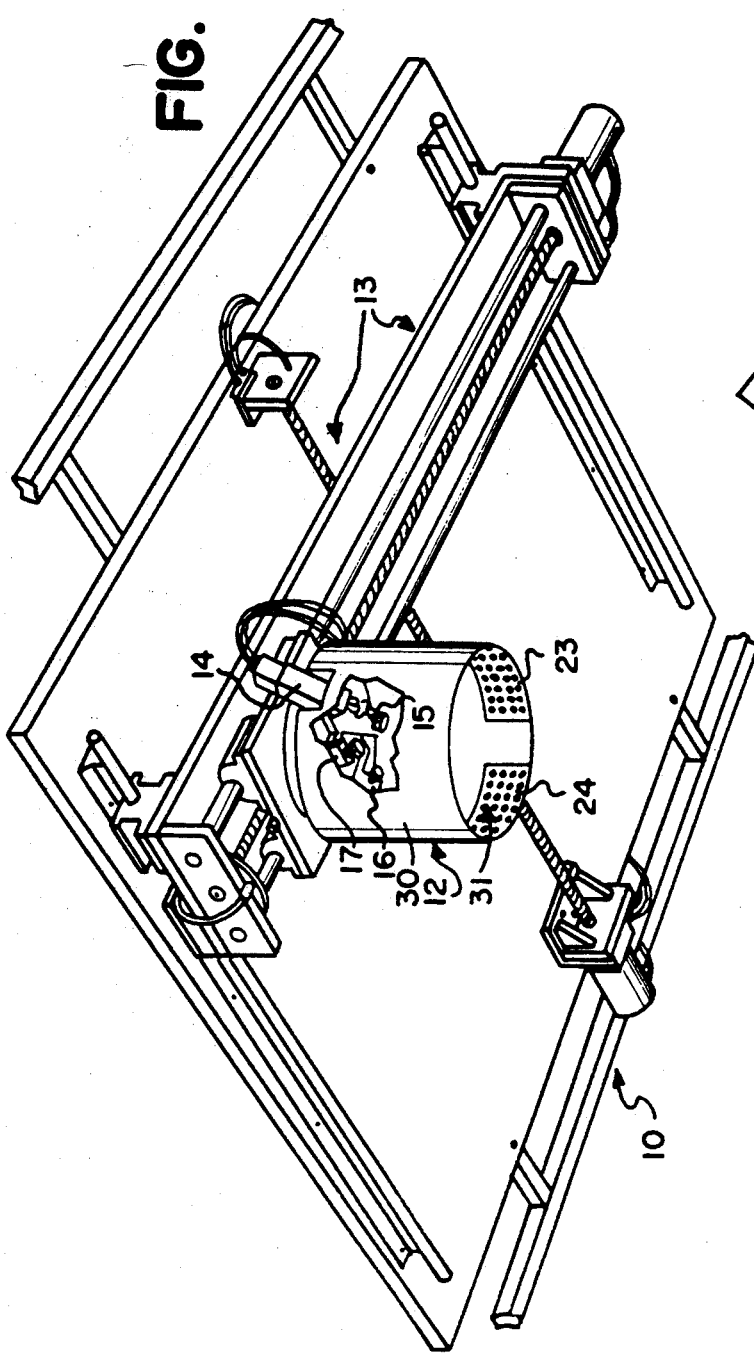
FIG. 1 is a perspective view of an apparatus for inspecting SMT printed circuit boards in accordance with the present invention.

FIG. 1 shows an apparatus 10 for inspecting printed circuit boards in accordance with the present invention. The apparatus 10 generally includes an inspection head 12 which is supported for predetermined movement in a defined plane by an X-Y table which is generally designated as 13, using any of a variety of servo-motor controls which are in themselves known to a person of ordinary skill in this art.

Both the inspection head 12 and the associated X-Y table 13 are in many ways similar to the inspection head and X-Y table of the Model 5511A Printed Circuit Board Inspection System which is used to inspect through-the-hole printed circuit boards from their bottom. However, in accordance with the present invention, the inspection head 12 and the associated X-Y table 13 are mounted in an inverted orientation so that the inspection head 12 is caused to travel across the top of a printed circuit board bearing SMT components, to permit an inspection from above. This is done primarily for convenience since this orientation tends to reduce undesirable movement of the SMT components during the testing (and manufacturing) process. However, it would also be possible to inspect such printed circuit boards in other orientations, including from the bottom provided that appropriate adhesives were used to affix the SMT components to their associated printed circuit board. Detail regarding construction of the inspection head 12 and the manner in which the inspection head 12 is caused to proceed across a printed circuit board to inspect its condition and provide an indication of potential defects, may be had with reference to U.S. patent application Ser. No. 06/735,859, which was filed on May 20, 1985, and which is entitled "Processes And Apparatus For Inspecting Printed Circuit Boards", the subject matter of which is incorporated by reference as if fully set forth herein.

Figure 2:
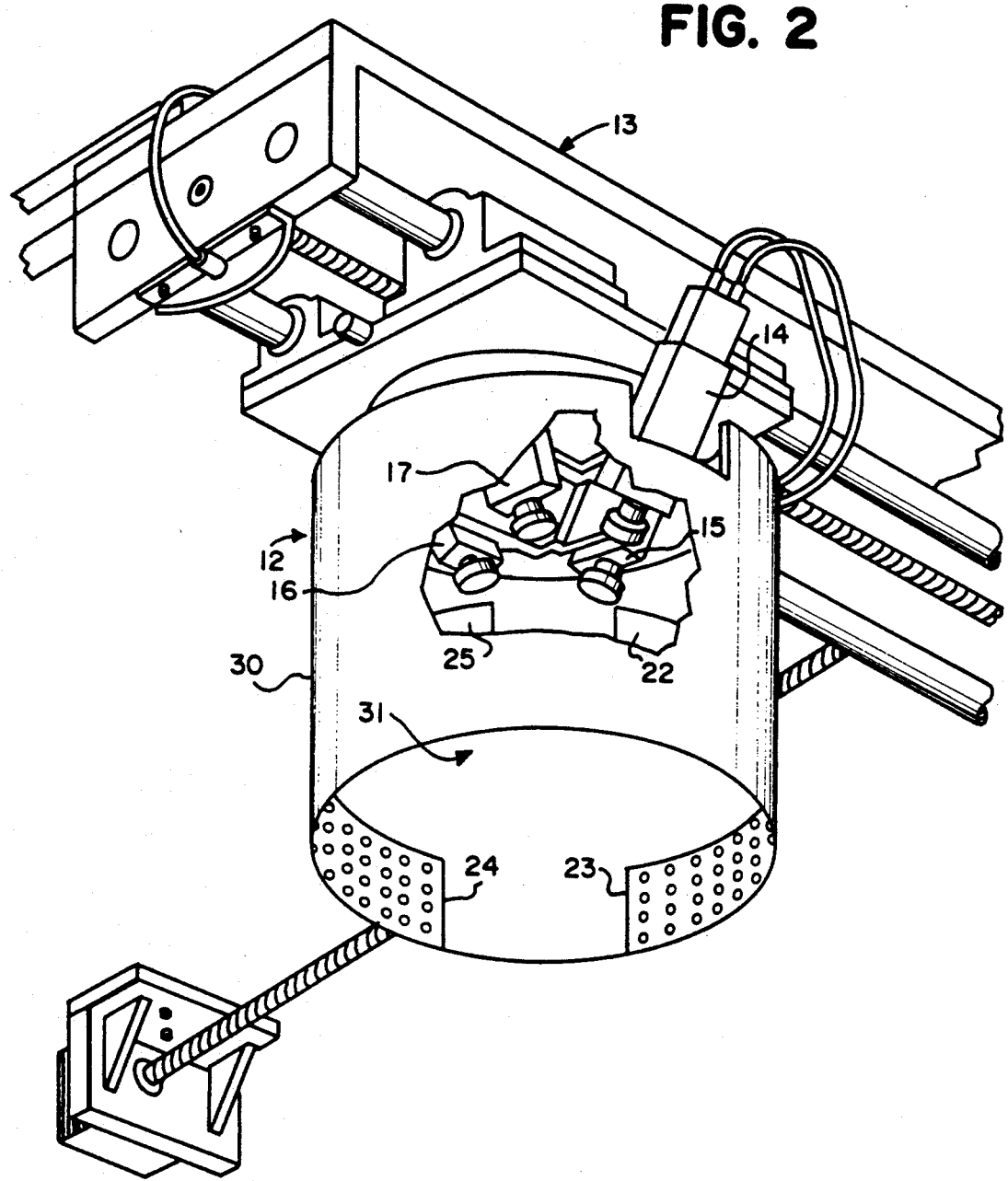
FIG. 2 is an enlarged view of the inspection head of the apparatus of FIG. 1.
Figure 3:
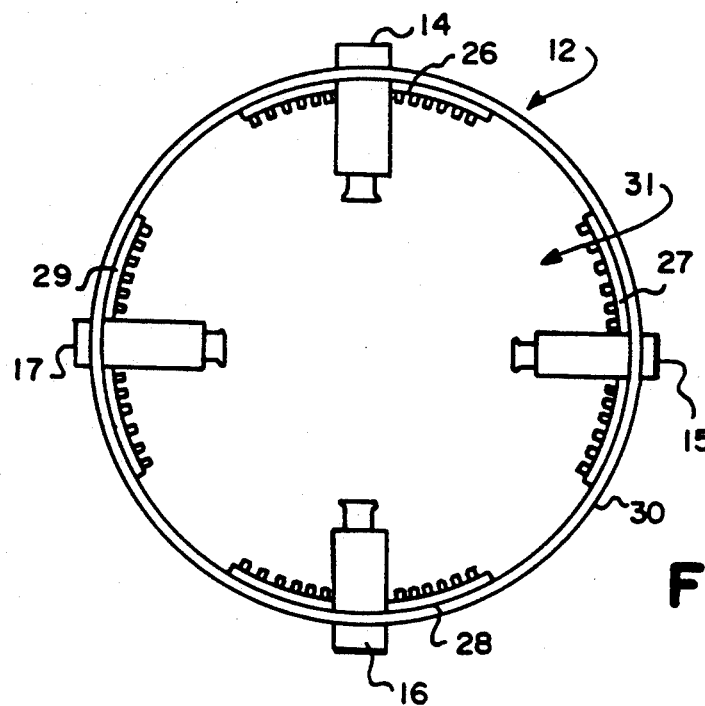
FIG. 3 is a top plan view of the inspection head.

However, by way of general description, and referring to FIGS. 2 to 4 of the drawings, it is seen that the inspection head 12 generally contains both a plurality of TV or video cameras 14, 15, 16, 17, and two series of lighting groups shown at 22, 23, 24, 25 and 26, 27, 28, 29, respectively. The cameras and the lighting groups are all contained within a hollow cylinder 30 which is used to house these components in a light-controlled (although not necessarily a light-tight) environment.

It will be noted that the cameras 14, 15, 16, 17 are orthogonally positioned within the cylinder 30, in general alignment with the moving tables of the X-Y table 13. This is done to place the cameras 14, 15, 16, 17 in normal alignment (which is preferred) with the anticipated components of a printed circuit board to be tested, which are also traditionally (although not always) orthogonally located upon the printed circuit board.

It will further be noted that the video cameras 14, 15, 16, 17 are arranged conically and disposed off of the vertical axis, projecting downwardly toward an open bottom 31 in the cylinder 30. Such positioning is preferred due to the discovery that this orientation enhances the probability of capturing reflected light from structure on the printed circuit board, while minimizing undesirable reflections (back scattered signals) from the printed circuit board itself. The angle at which the cameras are caused to deviate from the vertical axis of the inspection head 12 may lie in a range of from 30 to 45 degrees, with an angle of 30 degrees being particularly preferred in this regard.

This is done so that the axes of the cameras will be disposed to converge at the base of the cylinder 30, within successive "viewing fields" which are developed as the inspection head 12 is caused to proceed along the printed circuit board as will be described more fully below. Although a variety of configurations are suitable in this regard, it has been found that a viewing field measuring 1"×1" is preferable to achieve the resolution which is needed for proper determinations to be made in accordance with the present invention. This is preferably accomplished using camera lenses (and extension rings) having a focal length of from 16 to 25 mm.

In this fashion, the inspection head 12 is caused to proceed between successive viewing fields defined along the surface of the printed circuit board which is being inspected, to make determinations regarding the status of each component on the printed circuit board, its alignment with associated copper pads of the printed circuit board, and the integrity of any solder connections which have been made, as follows.

First to be discussed will be the testing procedures which are to be performed prior to soldering. As is conventional, automated machinery will operate to place components (both active and passive) in position upon the printed circuit board so that the components are placed in their desired location with all connecting leads in proper registration with any connecting pads which are necessary to effectively interconnect the component with the printed circuit board. An epoxy adhesive or solder paste provided on the surface of the printed circuit board is used to maintain each placed component in its desired position during the board-filling procedure, and during the subsequent soldering procedure. At this point in the manufacturing process, two tests are necessary to verify the integrity of the board which is under construction.

First, it is necessary to verify that a component has been effectively placed in its intended position on the printed circuit board. Thus, a failure to detect a given component indicates either that the automated machinery has not placed the component on the board, or that the placed component has detached from the board and is no longer present.

Second, assuming that the component is present on the board, it then becomes necessary to verify that all connecting leads or pins are in correct registration with the pads to which they will be connected during the soldering procedure. This is because even though a given component may be present on the board, a skewed or incorrect placement of the component will result in an improper solder connection, leading to a defective board. This is particularly so in connection with integrated circuit components, the connecting leads or pins of which are becoming more numerous and more closely spaced as technology progresses.

In the event that a defect is located, steps are then taken to advise the operator of the apparatus 10 of the defect, and its location, to facilitate correction of the problem.

These inspections are accomplished by sequentially accessing each of the cameras 14, 15, 16, 17, preferably in combination with the lighting groups 22, 23, 24, 25. High speed, high intensity, light emitting diodes (LED's) are preferably used for this purpose, to provide sufficient light for the cameras and because such LED's are advantageously controlled by appropriate electronic switching circuitry. Such control may include not only a selective activation of LED's, as will be described more fully below, but also a variable adjustment of the intensity of the LED's which have been selected for activation. Controlling the intensity of the lighting which has been selected allows features of a printed circuit board to be more fully developed, enhancing the contrast between the printed circuit board and the components and component features which it contains.

To obtain the best contrast between a component end which is being checked for, and the background of the printed circuit board, it is generally preferred that upon accessing a given camera, the illumination which will be used in connection with that camera will be the nearest adjacent lighting group which is positioned closest to the printed circuit board. Thus, for example, in accessing the camera 14, the lighting group 22 would preferably be used. In accessing the camera 15, the lighting group 23 would preferably be used, and so forth.

Following the sequential acquisition of images from all four of the cameras 14, 15, 16, 17 (obtaining data from four viewing angles), the acquired data is then assembled and compared with a master file which represents a valid (correctly assembled) printed circuit board construction. This is accomplished by defining a plurality of "windows" within a particular viewing field which correspond to the expected locations of the scheduled components, and their attachment leads or pins. Detected reflections are then compared with these pre-established norms to determine whether a particular component feature (side, edge, etc.) lies within its anticipated window, as well as to determine whether the component's connecting leads or pins lie within their anticipated windows. This is generally accomplished by determining the amount of reflected light which is detected within a particular window, and whether the detected amount of reflected light meets a prescribed threshold. If so, the placement is deemed correct. If not, a defect is indicated. This can also be accomplished by comparing the location of the component feature, or connecting lead or pin, with the location of the window, and then determining whether these locations are within a prescribed tolerance, if desired.

As previously indicated, any of a number of different components may be located on a given printed circuit board. However, it is traditional that these components will lie in a transverse or longitudinal origination on the printed circuit board. Accordingly, the ends of these components, and their connecting leads or pins, should be capable of being detected by at least one of the four orthogonally disposed cameras which are provided in the inspection head 12. However, it will be understood that all camera angles will not always be necessary to determine the proper placement of a particular component, or its connections, depending upon the component's configuration. Accordingly, to reduce data processing times, it is preferred that while all four camera angles will be viewed (acquired), only necessary camera angles (acquisitions) will be processed to make the determinations which are necessary. This can be pre-programmed either based upon a known (correct) board configuration, or using a library associated with the apparatus 10 which contains (and defines) the necessary configurations which are to be monitored.

In any event, the apparatus 10 operates to sequentially check each of the components which are to be located within a particular viewing field, as previously described, as the inspection head 12 is moved from the subject viewing field to an adjacent viewing field.

These results are stored for later interpretation, following the inspection of each of the viewing fields of a particular circuit board. Subsequent review of these results, particularly any detected defects, is then made possible either visually, making use of a video monitor for displaying recorded viewing fields, or a paper tape (or other recording device) which lists the locations of any detected defects. To be noted is that these results are enhanced by the same features (multiple angled cameras and controllable lighting) which enhanced the initial gathering of such data, as well.

Figure 5:
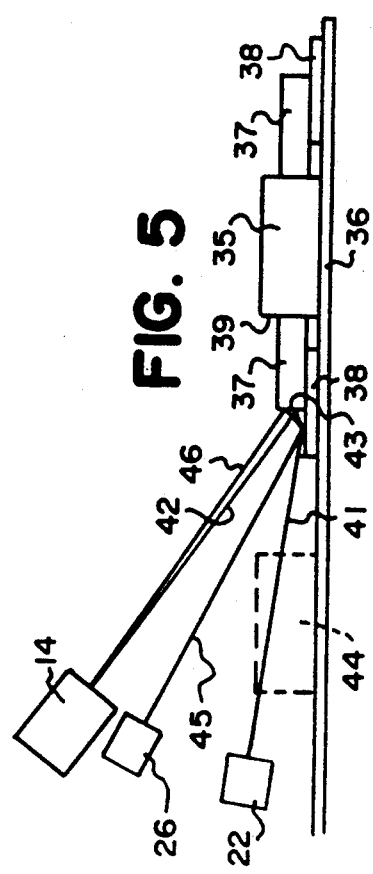
FIG. 5 is a schematic elevational view illustrating inspection of an SMT component on a printed circuit board using the apparatus shown in FIGS. 1 to 4.

The foregoing inspection procedures are schematically illustrated in FIG. 5 of the drawings, which shows a component 35 which is affixed to a printed circuit board 36 so that the connecting leads 37 are in alignment with their respective connecting pads, shown at 38. For purposes of this discussion, it is assumed that the camera 14 has been accessed, in combination with the lighting group 22 (as is generally preferred). Placement of the edge 39 of the component 35, and accordingly of the component itself, can be detected by monitoring contrasts between the levels of light which are associated with the end 39 of the component 35 (resulting from differentials in brightness, color, surface texture and reflectivity, etc.) and the levels of light which are associated with surrounding structures such as the surface of the printed circuit board 36. Placement of the lead 37 can be detected by monitoring projected light (arrow 41) which is reflected back upon the camera 14 (arrow 42). To be noted is that this reflection takes advantage of, and results from a "corner effect" wherein light is reflected from the edge 43 of the lead 37 which is itself reflected from the surface of the connecting pad 38. This is permitted by the tinned surfaces of the connecting pad 38 and the edge 43, providing a significant amount of reflected light for use in detecting the placement of component connections. Similar data is sequentially acquired by the cameras 15, 16, 17 concerning each component feature, lead and/or pin which has been prescribed for testing by the system, for subsequent processing as previously described.

In determining the sequence of inspections (verifications) which are to be performed, steps are preferably taken to accommodate specifics regarding the configuration of a particular printed circuit board. In particular, this relates to the manner in which lighting is applied to the printed circuit board to properly expose the components which it contains for the optimum delivery of information to the receiving camera. For example, as previously indicated, it is generally preferred to make use of the lower series of lighting groups 22, 23, 24, 25, since this has been found to generally provide the best contrast between the component and the printed circuit board. However, referring to FIG. 5, this may tend to cast shadows from an adjacent component such as the component 44 shown in phantom) to the component which is being inspected (the component 35) which can limit the ability to detect adjacent circuit components or component connections. In such case, steps can be taken to cause the higher lighting groups 26, 27, 28, 29 to activate, either in place of or in conjunction with the lighting groups 22, 23, 24, 25, to effectively expose the components on the printed circuit board. For example, as shown in FIG. 5, the lighting group 26 could be used in place of the lighting group 22 (or in combination) to effectively illuminate the end 39 of the component 35, and to provide incident light (arrow 45) for reflection from the end 43 of the connecting lead 37 (arrow 46). Steps can also be taken to vary the intensity of the lighting which is applied, to further develop these various features as previously described. Generally, this determination will be an empirical, operator-controlled function which will become apparent when board testing commences, and a particular trend develops.

Next to be discussed will be the testing procedures which are to be performed following the soldering phase of the manufacturing process. At this point in the manufacturing process, three tests are necessary to verify the integrity of the board which is under construction. First, it is again necessary to verify the presence or absence of a particular component, and its connections with the printed circuit board. This is to make sure that components have not fallen from the board or moved during the soldering process. This inspection is made in the same way as the inspections which were made during the pre-soldering phase of the manufacturing process.

Figure 6:
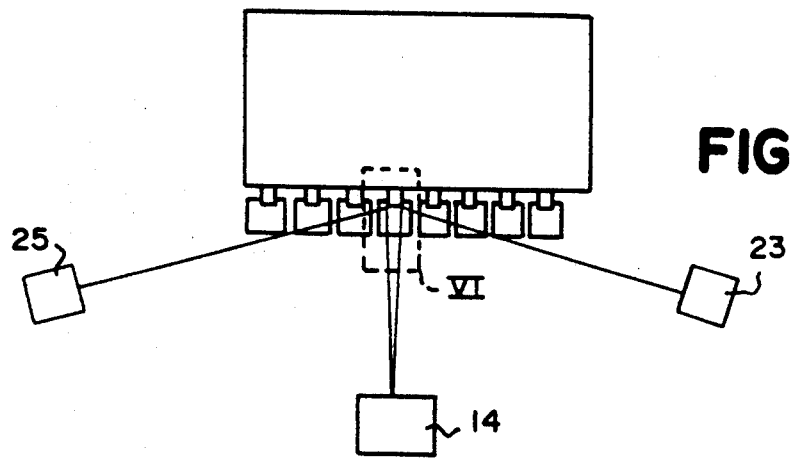
FIG. 6 is a schematic plan view illustrating inspection of an SMT component on a printed circuit board, for solder fillet quality.
Figure 6A:
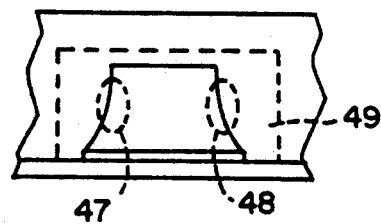
FIG. 6a is an enlarged, partial elevational view of the solder connection shown in FIG. 6 at VI.

Second, it is necessary to check the quality of each solder connection by inspecting the shape of the solder fillet which has been formed between the component and the printed circuit board. This is again accomplished by sequentially acquiring images from the cameras 14, 15, 16, 17, and monitoring reflected light detected within the window which is established for each solder fillet (connection) to be made. However, in connection with this inspection procedure, a different lighting sequence is preferably used. Rather than activating one of the nearest adjacent lighting groups (either the higher or lower group), steps are taken to simultaneously activate transversely disposed lighting groups positioned on either side of a particular camera. For example, referring to FIG. 6 of the drawings, in accessing the camera 14 steps would be taken to simultaneously activate the lighting groups 23, 25, the lighting groups 27, 29, or a combination of these lighting groups. The same lighting groups would be activated when accessing the camera 16. In accessing the cameras 15, 17, steps would be taken to simultaneously activate the lighting groups 22, 24, the lighting groups 26, 28, or a combination of these lighting groups, as desired. This tends to produce a reflected pattern within a particular window such as is illustrated in FIG. 6a of the drawings, having a pair of reflections 47, 48 located in a single window 49. An analysis is then made of the contrast ratio (i.e. brightness to darkness) within the window 49 to determine whether the desired reflections 47, 48 are present. If the contrast ratio exceeds a prescribed threshold, an effective solder fillet is deemed to exist. If not, a defect is declared and the operator is advised accordingly.

Figure 7:
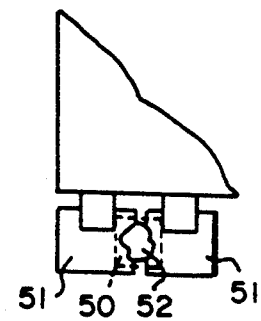
FIG. 7 is a partial plan view illustrating inspection of an SMT component on a printed circuit board, for solder bridges.

Third, it is necessary to inspect the solder connections for solder bridges which improperly connect adjacent leads or pins, or adjacent connecting pads or paths. Referring to FIG. 7, this is done by defining windows (e.g. at 50) in regions where potential solder bridges can form (e.g. between adjacent connections 51 of an active circuit component) and inspecting for reflections resulting from a solder bridge 52 occurring in the prescribed window. Considering the orientation of these solder bridges, their detection will generally be best accomplished using the higher lighting groups 26, 27, 28, 29, to obtain the best possible reflection off potential solder bridges. To be noted is that this test can be performed either during the inspection for the presence or absence of components and their electrical connections, or in a separate inspection sequence.

It will be understood that various changes in the details, materials and arrangement of parts which have been herein described and illustrated in order to explain the nature of this invention may be made by those skilled in the art within the principle and scope of the invention as expressed in the following claims. An example of this is that while the foregoing describes a four camera system for performing inspections in accordance with the present invention, the previously described improvements are also capable of being produced by a five camera system, which uses a fifth, axially disposed camera in addition to the previously described four camera array. Other variations are also possible.

What is claimed is:

1. An apparatus for inspecting a printed circuit board having a surface mounted component affixed thereto, said component having side edges projecting from the surface of said printed circuit board and connecting leads or pins projecting from the side edges of said component to connecting pads on the surface of said printed circuit board, comprising:

a plurality of means for illuminating said side edges, said connecting leads or pins, and said surface, positioned to provide contrasting reflections from said side edges, said connecting leads or pins, and said surface; and camera means for receiving light reflected from said side edges, said connecting leads or pins, and said surface;

wherein said illuminating means and said camera means are located in an inspection head positioned over said printed circuit board;

means for moving said inspection head to different positions over said printed circuit board; and means for switchably controlling different ones of said plurality of illuminating means to selectively activate different combinations of said illuminating means and said camera means to illuminate said side edges, said connecting leads or pins, and said surface to provide light reflected from said side edges, said connecting leads or pins, and said surface to said camera means to perform different inspections of said component, said connecting leads or pins, and said connecting pads on said printed circuit board.

2. The apparatus of claim 1 having means for performing said inspecting in a first viewing field before said inspection head is moved to a second viewing field to be inspected.

3. The apparatus of claim 1 wherein said controlling means switchably controls four orthogonally disposed cameras and eight lighting groups, wherein two lighting groups are positioned adjacent to each of said cameras.

4. The apparatus of claim 3 wherein said two lighting groups include a first lighting group positioned adjacent to said camera means, and a second lighting group positioned adjacent to said printed circuit board.

5. The apparatus of claim 4 wherein said controlling means operates either said first lighting group, said second lighting group, or a combination of said first and second lighting groups according to the configuration of said component and other components adjacent thereto.

6. The apparatus of claim 5 wherein said controlling means adjusts the intensity of said lighting groups according to the configuration of said component and other components adjacent thereto.

7. The apparatus of claim 3 having means for inspecting if said component has been placed on said printed circuit board, wherein said controlling means sequentially activates each of said cameras together with one of the two lighting groups positioned adjacent to said activated camera to produce detectable contrasts between light levels associated with said side edges and light levels associated with said surface.

8. The apparatus of claim 7 having means for inspecting if said component has been correctly located on said printed circuit board, wherein said controlling means sequentially activates each of said cameras together with one of the two lighting groups positioned adjacent to said activated camera to direct light toward said connecting leads or pins for reflection to said activated camera.

9. The apparatus of claim 8 wherein said inspecting is performed before a soldering procedure has been completed.

10. The apparatus of claim 8 wherein said inspecting is performed after a soldering procedure has been completed.

11. The apparatus of claim 3 having means for inspecting if a properly shaped solder fillet has been produced in a soldering procedure, wherein said controlling means sequentially activates each of said cameras together with two lighting groups, positioned laterally to each side of said camera, to direct light toward opposing curved portions of said solder fillet for reflection to said activated camera.

12. The apparatus of claim 3 having means for inspecting if a solder bridge exists between adjacent solder connections, wherein said controlling means sequentially activates each of said cameras together with the lighting group positioned nearest to said activated camera to direct light toward a solder bridge for reflection to said activated camera.

13. The apparatus of claim 1 having means for comparing reflected light received by said camera means with a predetermined window for receiving said reflected light, to determine if said reflected light is located within said window.

14. The apparatus of claim 13 having microprocessor means for performing said comparing and for reporting of detected defects.

15. The apparatus of claim 14 having a monitor for visual inspection of said detected defects.

16. The apparatus of claim 14 having a recording device for recording the location of said detected defects.

17. A method for inspecting a printed circuit board having a surface mounted component affixed thereto, said component having side edges projecting from the surface of said printed circuit board and connecting leads or pins projecting from the side edges of said component to connecting pads on the surface of said printed circuit board, comprising:

illuminating said side edges, said connecting leads or pins, and said surface with illuminating means including a plurality of lighting groups, providing contrasting reflections from said side edges, said connecting leads or pins, and said surface; and receiving light reflected from said side edges, said connecting leads or pins, and said surface, in camera means adapted to receive said contrasting reflections;

wherein said plurality of lighting groups are positioned adjacent to said camera means;

switchably controlling said illuminating by selectively activating different combinations of said lighting groups and said camera means; and illuminating said side edges, said connecting leads or pins, and said surface by selecting between said lighting groups according to the configuration of said component and other components adjacent thereto, providing light reflected from said side edges, said connecting leads or pins, and said surface to said camera means to perform different inspections of said component, said connecting leads or pins, and said connecting pads on said printed circuit board.

18. The method of claim 17 wherein said inspecting includes inspecting a first viewing field and thereafter moving to a second viewing field to be inspected, while simultaneously processing data resulting from said first inspecting during said moving.

19. The method of claim 17 which further comprises adjusting the intensity of said lighting groups according to the configuration of said component and other components adjacent thereto.

20. The method of claim 17 wherein said inspecting includes activating said camera means and illuminating means positioned adjacent thereto.

21. The method of claim 20 wherein said inspecting includes directing light toward said side edges, and detecting contrasts between light levels associated with said side edges and light levels associated with said surface to determine if said component has been placed on said printed circuit board.

22. The method of claim 20 wherein said inspecting includes directing light toward said connecting leads or pins for reflection to said camera means, to determine if said component has been correctly located on said printed circuit board.

23. The method of claim 20 wherein said inspecting includes directing light toward connecting pads adjacent to said component, for reflection to said camera means, to determine if a solder bridge exists between adjacent solder connections.

24. The method of claim 17 wherein said inspecting includes activating said camera means together with illuminating means positioned laterally to each side of said camera means, directing light toward opposing curved portions of a solder connection, for reflection to said camera means, to determine if said solder connection incorporates a properly shaped solder fillet.

25. The method of claim 17 which further comprises comparing reflected light received by said camera means with a predetermined window for receiving said reflected light, to determine if said reflected light is located within said window.

26. The method of claim 25 which further comprises inspecting detected defects on a monitor coupled to said camera means.

27. The method of claim 25 which further comprises recording the location of detected defects on a recording device coupled to said camera means.

* * * * *